United States Patent
Kao et al.

(10) Patent No.: US 10,431,465 B2
(45) Date of Patent: Oct. 1, 2019

(54) SEMICONDUCTOR STRUCTURES AND METHODS OF FORMING THE SAME

(71) Applicant: Vanguard International Semiconductor Corporation, Hsinchu (TW)

(72) Inventors: Chih-Ming Kao, Jhubei (TW); Rong-Gen Wu, Taichung (TW); Han-Wen Chang, Sinfong Township (TW); Chun-Hsu Chen, Sinpu Township (TW); Yu-Chun Ho, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/707,819

(22) Filed: Sep. 18, 2017

(65) Prior Publication Data

US 2019/0088484 A1    Mar. 21, 2019

(51) Int. Cl.
*H01L 29/66* (2006.01)
*H01L 21/28* (2006.01)
(Continued)

(52) U.S. Cl.
CPC .. *H01L 21/28008* (2013.01); *H01L 21/28035* (2013.01); *H01L 21/28255* (2013.01);
(Continued)

(58) Field of Classification Search
CPC ............. H01L 29/0646; H01L 29/4236; H01L 29/66666; H01L 21/28008;
(Continued)

(56) References Cited

U.S. PATENT DOCUMENTS 5,814,858 A * 9/1998 Williams ............ H01L 29/7828
257/328
9,887,287 B1 * 2/2018 Lichtenwalner ..... H05K 999/99
(Continued)

FOREIGN PATENT DOCUMENTS

TW    200534359 A     10/2005
TW    201037836 A1    10/2010
(Continued)

OTHER PUBLICATIONS

Taiwanese Office Action and Search Report, dated Apr. 19, 2018, for Taiwanese Application No. 106125080, is provided.

*Primary Examiner* — Nathan W Ha
(74) *Attorney, Agent, or Firm* — Birch, Stewart, Kolasch & Birch, LLP (57) ABSTRACT

A method of fabricating a semiconductor structure includes providing a semiconductor substrate, forming a trench in the semiconductor substrate, overfilling the trench with a first semiconductor material, wherein the first semiconductor material does not have a dopant, forming a second semiconductor material on the first semiconductor material, wherein the second semiconductor material contains a dopant, and performing a thermal treatment so that the dopant in the second semiconductor material diffuses into the first semiconductor material to form a doped third semiconductor material in the trench.

7 Claims, 5 Drawing Sheets

(51) Int. Cl.
*H01L 29/06* (2006.01)
*H01L 29/423* (2006.01)
*H01L 29/78* (2006.01)
*H01L 21/761* (2006.01)
*H01L 29/40* (2006.01)
*H01L 21/3215* (2006.01)

(52) U.S. Cl.
CPC ...... *H01L 21/32155* (2013.01); *H01L 21/761* (2013.01); *H01L 29/0646* (2013.01); *H01L 29/401* (2013.01); *H01L 29/407* (2013.01); *H01L 29/4236* (2013.01); *H01L 29/66666* (2013.01); *H01L 29/66734* (2013.01); *H01L 29/7813* (2013.01); *H01L 29/7827* (2013.01)

(58) Field of Classification Search
CPC ......... H01L 21/28035; H01L 21/28255; H01L 21/32155
See application file for complete search history.

(56) References Cited

U.S. PATENT DOCUMENTS

| | | | | |
|---|---|---|---|---|
| 9,960,230 | B2* | 5/2018 | Esteve | H01L 29/66734 |
| 2006/0273379 | A1* | 12/2006 | Bhalla | H01L 29/4983 |
| | | | | 257/330 |
| 2009/0311839 | A1* | 12/2009 | Miyahara | H01L 21/26513 |
| | | | | 438/270 |
| 2010/0193799 | A1* | 8/2010 | Nakano | H01L 29/1608 |
| | | | | 257/77 |
| 2011/0006363 | A1* | 1/2011 | Hsieh | H01L 29/7813 |
| | | | | 257/330 |
| 2012/0032261 | A1* | 2/2012 | Hsieh | H01L 29/7813 |
| | | | | 257/334 |
| 2012/0261737 | A1* | 10/2012 | Hsieh | H01L 21/82348 |
| | | | | 257/315 |
| 2012/0326207 | A1* | 12/2012 | Yoshimochi | H01L 29/866 |
| | | | | 257/139 |
| 2014/0015104 | A1* | 1/2014 | Su | H01L 21/225 |
| | | | | 257/611 |
| 2015/0076591 | A1* | 3/2015 | Meyer | H01L 21/28008 |
| | | | | 257/330 |
| 2015/0340487 | A1* | 11/2015 | Siemieniec | H01L 21/046 |
| | | | | 257/77 |
| 2015/0372131 | A1* | 12/2015 | Hebert | H01L 29/7813 |
| | | | | 257/330 |
| 2016/0172468 | A1* | 6/2016 | Esteve | H01L 29/66734 |
| | | | | 438/270 |
| 2016/0351680 | A1* | 12/2016 | Soeno | H01L 29/66068 |
| 2016/0365413 | A1* | 12/2016 | Wagner | H01L 29/1095 |
| 2017/0148893 | A1* | 5/2017 | Baburske | H01L 29/66348 |
| 2018/0212021 | A1* | 7/2018 | Roig-Guitart | H01L 29/0634 |

FOREIGN PATENT DOCUMENTS

| | | |
|---|---|---|
| TW | 201624706 A | 7/2016 |
| TW | I567979 B | 1/2017 |

* cited by examiner

SEMICONDUCTOR STRUCTURES AND METHODS OF FORMING THE SAME

BACKGROUND

Technical Field

The disclosure relates to semiconductor fabricating technologies, and more particularly, to semiconductor structures having doped semiconductor materials filled in trenches and methods of forming the same.

Description of the Related Art

The semiconductor integrated circuit industry has experienced rapid growth in the past several decades. Advances in semiconductor materials and fabricating technologies make the size of elements increasingly smaller and make its fabricating technologies more and more complex. As a result of the technological advances in semiconductor processes, progress on the aspects of miniaturization of the semiconductor elements and performance enhancement has been achieved. In the course of semiconductor evolution, the number of interconnected elements per unit of area has increased as the size of the smallest elements that can be reliably fabricated has decreased.

In order to effectively scale-down the dimensions of semiconductor elements, trenches perpendicular to the top surface of a substrate are generally formed in the substrate by photolithography and etching processes, and materials are filled into the trenches, or films are formed in the trenches, to be a part of the semiconductor elements. For example, an insulator material may be filled into the trenches to be a shallow trench isolation (STI).

The semiconductor integrated circuit industry has produced numerous developments in an effort to scale-down the size of elements. However, as the size of the smallest component has continuously decreased, numerous challenges have arisen. For example, as the width of a trench is reduced (or its aspect ratio is increased), defects such as voids or pipelines may be formed in the material filled in the trench, which results in a decrease in the reliability of the semiconductor device. Therefore, the industry still has to improve the method of fabricating semiconductor devices to overcome the problems caused by the reduction of the element dimension.

SUMMARY

Some embodiments of the present disclosure provide a method of fabricating a semiconductor structure. The method includes providing a semiconductor substrate, forming a trench in the semiconductor substrate, overfilling the trench with a first semiconductor material, wherein the first semiconductor material does not have a dopant, forming a second semiconductor material on the first semiconductor material, wherein the second semiconductor material contains a dopant, and performing a thermal treatment so that the dopant in the second semiconductor material diffuses into the first semiconductor material to form a doped third semiconductor material in the trench.

Some embodiments of the present disclosure further provide a semiconductor structure. The semiconductor structure includes a semiconductor substrate, a trench disposed in the semiconductor substrate, and a doped semiconductor material filled in the trench, wherein a top surface of the doped semiconductor material is planar with a top surface of the semiconductor substrate, and a dopant in the doped semiconductor material has a decreasing concentration gradient in a depth direction of the trench.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Semiconductor structures having a doped semiconductor material filled in a trench and methods of forming the same of some embodiments of the present disclosure are described in detail in the following description. It should be noted that the following description provides various embodiments and examples to embodied in various forms of some embodiments of the present disclosure. The specific elements and configurations described in the following detailed description are set forth in order to clearly describe the present disclosure. It will be apparent, however, that the exemplary embodiments set forth herein are used merely for the purpose of illustration, and the inventive concept is not limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "a first element disposed on/over a second element", may indicate the direct contact of the first element and the second element, or it may indicate a non-contact state with one or more intermediate elements between the first element and the second element. In the above situation, the first element may not be in direct contact with the second element.

In addition, in this specification, relative expressions are used. For example, "lower", "bottom", "higher" or "top" are used to describe the position of one element relative to another element. It should be appreciated that if a device is flipped upside down, an element that is "lower" will become an element that is "higher".

Some embodiments of the present disclosure describe semiconductor structures having a doped semiconductor material filled in a trench and methods of fabricating the same. The embodiments may be applied to an integrated circuit (IC) which includes such as microprocessors, memory elements and/or other elements. The abovementioned IC may also include various passive and active microelectronic elements, such as thin film resistors, capacitors (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, vertical double-diffused MOS (VDMOS) transistors, high-power MOS transistors, or other types of transistors. One of ordinary skill may recognize that other types of semiconductor elements may benefit from the embodiments of the present disclosure.

This description of the exemplary embodiments is intended to be read in connection with the accompanying drawings, which are to be considered part of the entire written description. It should be understood that semiconductor structures and features in the drawings accompanied in the specification may not be drawn to scale. It is possible to enlarge or reduce the shape and the thickness of various elements to show the features of embodiments of the present disclosure clearly.

Figure 1A:
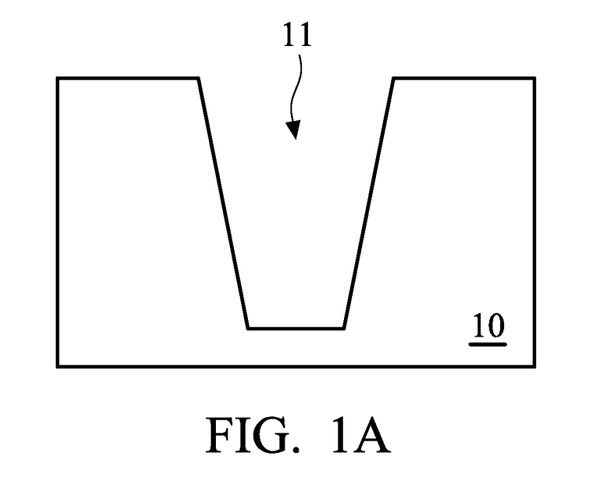
FIGS. 1A-1D illustrate cross-sectional views of various intermediate stages of a method of forming a semiconductor structure in accordance with an example.
Figure 1B:
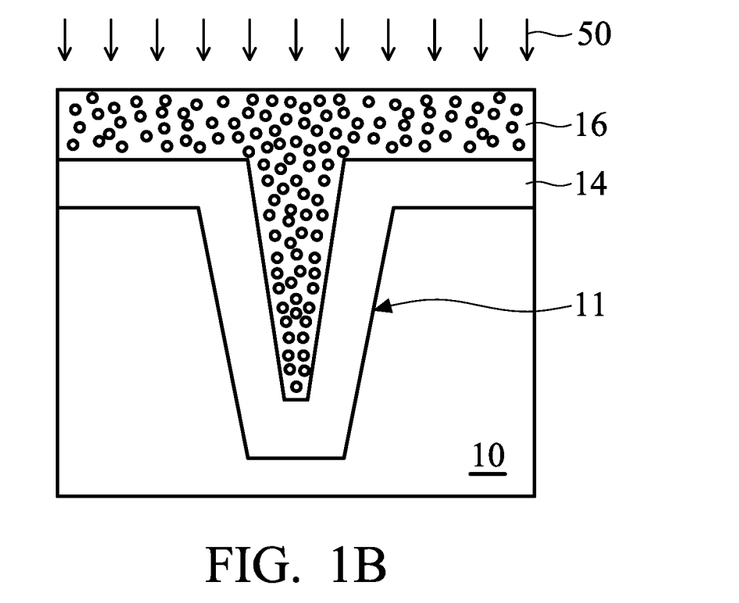

FIGS. 1A-1D illustrate cross-sectional views of intermediate stages of a method of forming a semiconductor structure 100 according to an example. Referring to FIGS. 1A and 1B, a semiconductor substrate 10 is provided, and then a trench 11 is formed in the semiconductor substrate 10. Next, a first semiconductor material 14 and a second semiconductor material 16 are formed sequentially on the semiconductor substrate 10 and in the trench 11. The first semiconductor material 14 does not have a dopant, and the second semiconductor material 16 contains a dopant. The trench 11 is partially filled with the first semiconductor material 14 so that the trench 11 is not completely filled. The second semiconductor material 16 fills the remaining portion of the trench 11 that is not filled by the first semiconductor material 14. Next, a heat treatment 50 (also referred as a diffusion process) is performed on the first semiconductor material 14 and the second semiconductor 16 so that the dopant in the second semiconductor material 16 diffuses into the first semiconductor material 14.

Figure 1C:
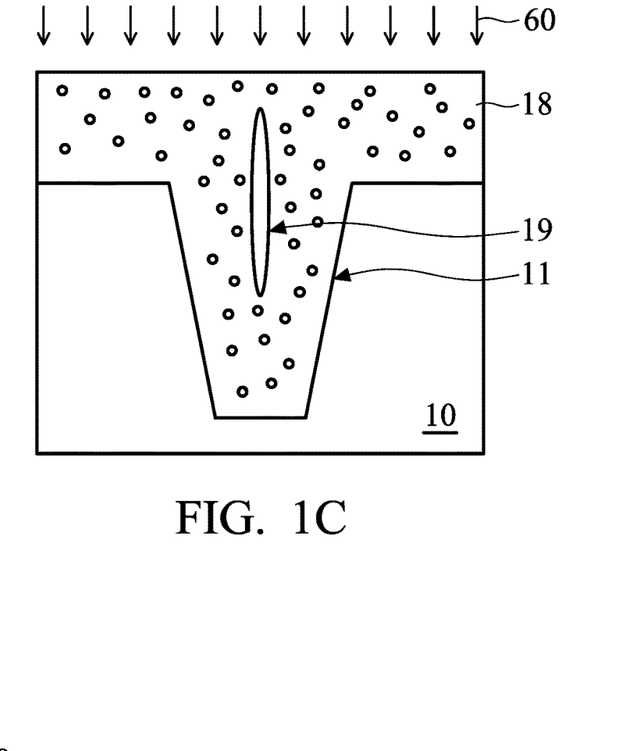
Figure 1D:
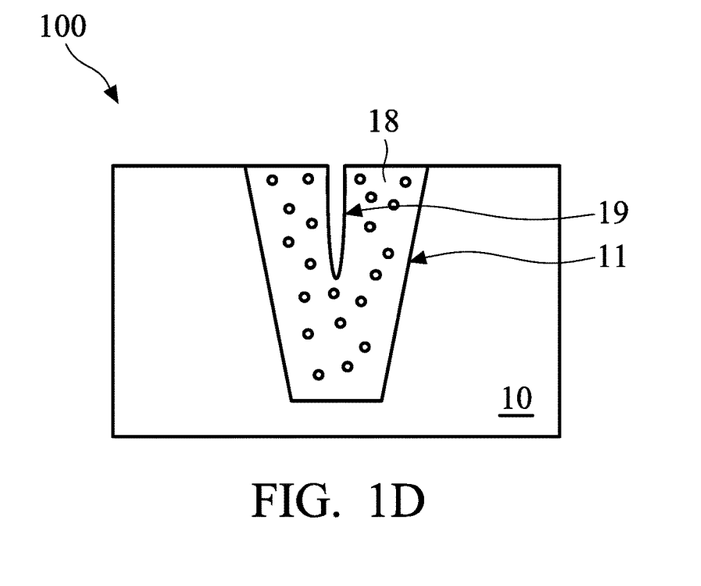

Referring to FIGS. 1C and 1D, a doped third semiconductor material 18 is formed after the heat treatment 50 is performed. Specifically, the doped third semiconductor material 18 is formed by the dopant in the second semiconductor material 16 diffusing into the first semiconductor material 14. Thereafter, as shown in FIG. 1C, a planarization process 60 is performed on the doped third semiconductor material 18 on the semiconductor substrate 10 to remove a portion of the doped third semiconductor material 18 outside the trench 11. Then, as shown in FIG. 1D, a semiconductor structure 100 having the doped third semiconductor material 18 filled in the trench 11 is formed.

It should be noted that since the first semiconductor material 14 does not have a dopant, and the second semiconductor material 16 contains a dopant, the second semiconductor material 16 has better flowability at high temperatures than the first semiconductor material 14. During the heat treatment 50, the second semiconductor material 16 is recrystallized, which results in its volume shrinking. Since the second semiconductor material 16 with better flowability is filled in the trench 11, a void or a pipeline 19 may be formed in the doped third semiconductor material 18 (as shown in FIG. 1C) after the heat treatment 50. After the planarization process 60, the void or pipeline 19 may be exposed from the top surface of the doped third semiconductor material 18 (as shown in FIG. 1D).

In the example shown in FIG. 1D, when the semiconductor structure 100 is subjected to subsequent processes (not shown), such as photolithography processes, etching processes, deposition process (such as formations of inter-layer dielectric layers, tungsten contacts, redistribution layers, etc.) or other semiconductor processes, materials (such as etchants, photoresists, dielectrics, metals, etc.) used in these processes will flow into the exposed void or pipeline 19 so that the doped third semiconductor material 18 is contaminated. That may cause damage or short-circuiting of a semiconductor device, including a semiconductor structure 100, and further result in decreasing the reliability of the semiconductor device. For example, while the doped third semiconductor material 18 is used as a gate electrode for a semiconductor device, the problem of high gate leak current will arise.

The aforementioned example with regards to FIGS. 1A-1D may be used to illustrate the problem of decreasing reliability of a semiconductor device caused by a doped semiconductor material filled in the trench before a heat treatment. Some embodiments of the present disclosure overfill a trench with an undoped semiconductor material, form a semiconductor material containing a dopant on the undoped semiconductor material, and then perform a heat treatment on both semiconductor materials. As a result, there is no void or pipeline formed in the semiconductor material filled in the trench during the heat treatment, and a doped semiconductor material is formed in the trench after the heat treatment. Therefore, the aforementioned problem which can arise in the semiconductor element is solved.

Figure 2A:
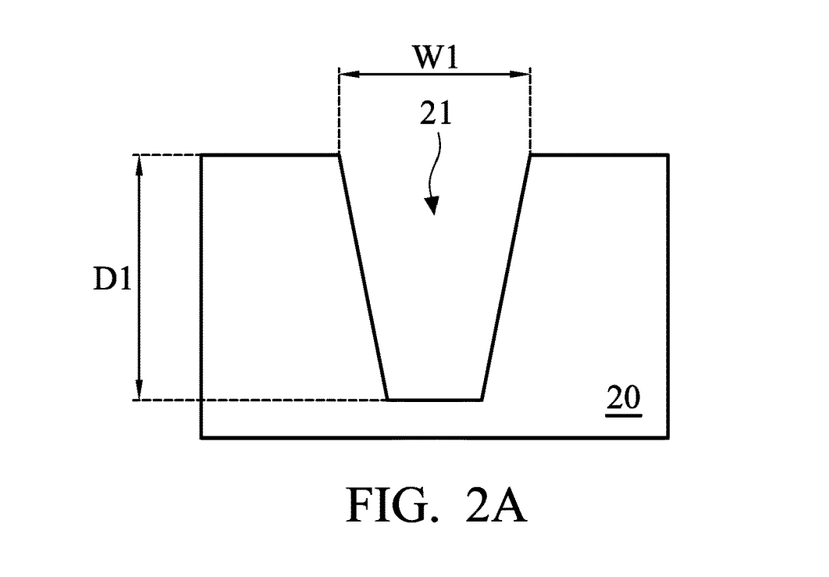
FIGS. 2A-2D illustrate cross-sectional views of various intermediate stages of a method of forming a semiconductor structure in accordance with some embodiments of the present disclosure.

FIGS. 2A-2D illustrate cross-sectional views of various intermediate stages of a method of forming a semiconductor structure 200 in accordance with some embodiments of the present disclosure. Referring to FIG. 2A, a semiconductor substrate 20 is provided, and then a first trench 21 is formed in the semiconductor substrate 20.

In some embodiments of the present disclosure, the semiconductor substrate 20 may be a silicon substrate. In other embodiments, the semiconductor substrate 20 may be a compound semiconductor substrate, such as a silicon germanium substrate, a gallium-arsenide substrate, or any other suitable compound semiconductor substrate. The semiconductor substrate 20 may include other features, such as various doped regions, for example, p-type wells or n-type wells, barrier layers and/or epitaxial layers. The semiconductor substrate 20 may be a semiconductor-on-insulator substrate, such as silicon-on-insulator (SOI) substrate. In some embodiments of the present disclosure, the semiconductor substrate 20 may also include doped epitaxial layers, gradient semiconductor layers, and/or a semiconductor layer over another different type of semiconductor layer, such as a silicon layer over a silicon germanium layer.

The first trench 21 is formed by recessing the semiconductor substrate 20 with a standard photolithography process and an etching process. For example, a patterned mask (not shown) is formed by performing a photolithography process on a region of the semiconductor substrate 20 on which the first trench 21 is pre-determined to be formed. Next, the semiconductor substrate 20 is recessed to form the first trench 21 using an etching process. The etching process may be dry etching, wet etching, or a combination thereof. In some embodiments, the first trench 21 has a first width W1 between about 4000 Å and about 16000 Å. The first trench 21 has a first depth D1 between about 7000 Å and about 60000 Å. Namely, an aspect ratio of the first trench 21 is between about 0.43 and about 15. However, in other embodiments, the first trench 21 may have any suitable depth, width and aspect ratio.

In addition, in some other embodiments, the steps of forming the first trench 21 may also include performing a corner rounding step, thereby tempering the stress concentration at the corners of the first trench 21. Although FIG. 2A shows that the first trench 21 has sidewalls inclined to the top surface of the semiconductor substrate 20, the sidewalls of the first trench 21 may intersect with the top surface of the semiconductor substrate 20 at any angle (such as being perpendicular to the top surface of the semiconductor substrate 20). Although FIG. 2A shows that the first trench 21 has a bottom surface which is a planar surface, the bottom surface of the first trench 21 may be a curved surface, such as a curved concave surface.

Figure 2B:
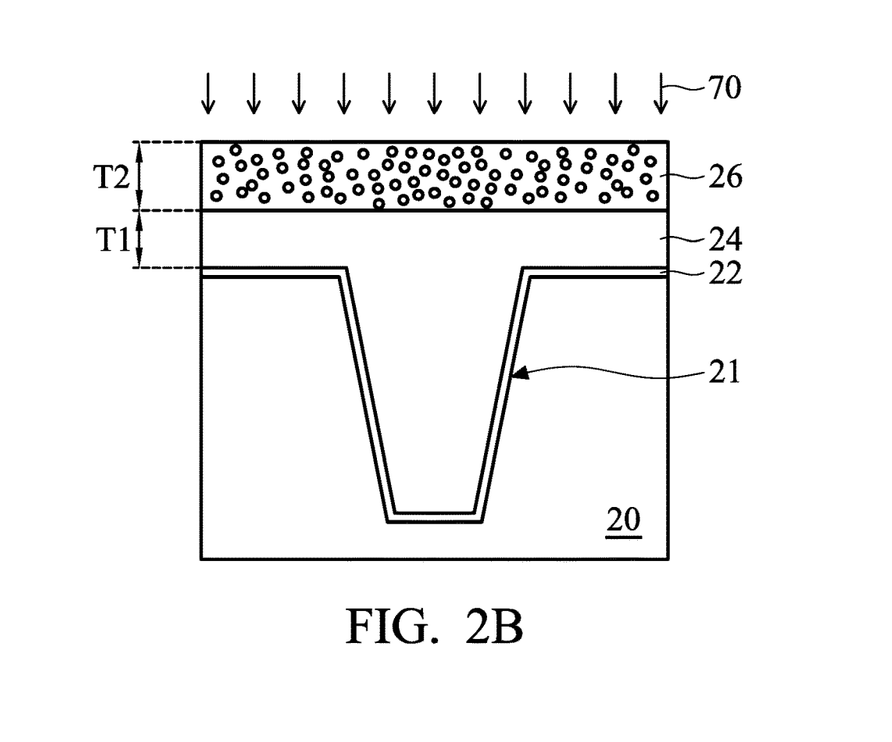

Next, referring to FIG. 2B, a lining layer 22, a first semiconductor material 24 and a second semiconductor material 26 are formed sequentially on the semiconductor substrate 20, wherein the first semiconductor material 24 overfills the first trench 21. In detail, the lining layer 22 is formed on the top surface of the semiconductor substrate 20 and on the sidewalls and the bottom surface of the first trench 21. The lining layer 22 conformally extends along the top surface of the semiconductor substrate 20 and along the sidewalls and the bottom surface of the first trench 21. The first semiconductor material 24 is formed on the lining layer 22, and the first trench 21 is overfilled with the first semiconductor material 24 so that the first trench 21 does not have a remaining portion. The second semiconductor material 26 is formed on the first semiconductor material 24. Since the first semiconductor material 24 overfills the first trench 21, so the second semiconductor material 26 is above the semiconductor substrate 20, the lining layer 22, the first semiconductor material 24 and the first trench 21, and the second semiconductor material 26 is not present in the first trench 21.

In some embodiments of the present disclosure, the materials of the lining layer 22 may include $SiO_2$, SiN or SiON. The lining layer 22 has a thickness ranging between about 100 Å and about 2500 Å. The lining layer 22 may also be made of high dielectric constant (high-k) dielectric materials, such as $TiO_2$, HfZrO, $Ta_2O_3$, $HfSiO_4$, $ZrO_2$, $ZrSiO_2$, combinations thereof, or any other suitable dielectric material. The lining layer 22 may be formed by thermal oxidation, chemical vapor deposition (CVD), atomic layer deposition (ALD), or any other suitable method.

In some embodiments of the present disclosure, the first semiconductor material 24 is an amorphous semiconductor material without a dopant, such as amorphous Si or amorphous Ge. The first semiconductor material 24 may be formed by physical vapor deposition (PVD), CVD, ALD, or any other suitable deposition method. In an embodiment of the present disclosure, the first semiconductor material 24 is an undoped amorphous Si which is formed by introducing a first precursor containing Si in a high-temperature deposition process. The first precursor may include dichlorosilane (DCS), silane ($SiH_4$), methyl silane ($SiCH_6$), a combination thereof, or any other suitable precursor.

In addition, in some embodiments of the present disclosure, during the formation of the first semiconductor material 24, since the first semiconductor material 24 is conformally deposited until overfilling the first trench 21, the first semiconductor material 24 has a first thickness T1 at least equal to or larger than half the first width W1 of the first trench 21 so that the first semiconductor material 24 can completely fill the first trench 21.

Figure 2C:
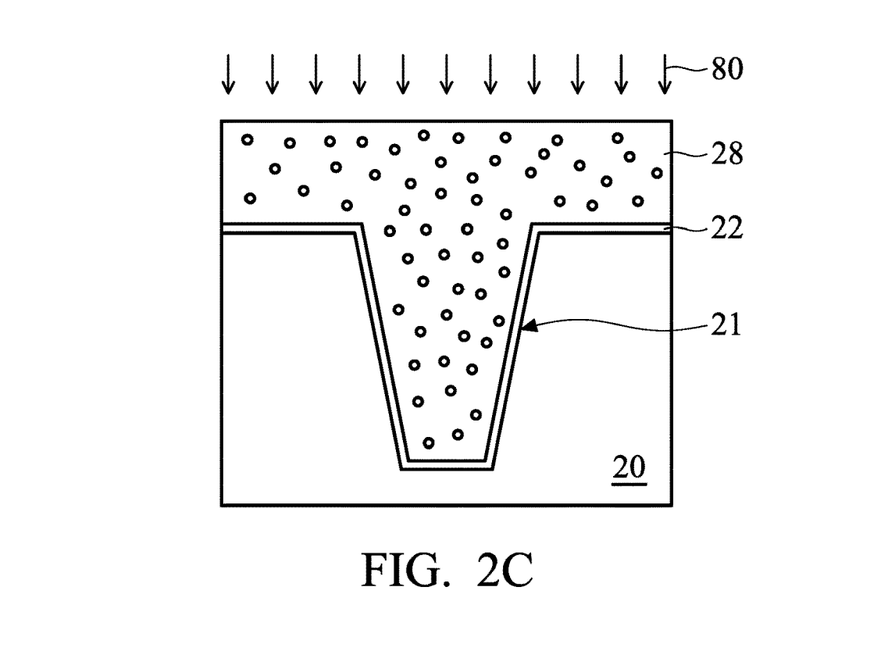

In some embodiments of the present disclosure, the second semiconductor material 26 is an amorphous semiconductor material with a dopant, such as an amorphous silicon or amorphous germanium containing a dopant. In some embodiments, the dopant may be an n-type dopant, such as As, P or Sb. In some other embodiments, the dopant may be a p-type dopant, such as Al, B or Ga. The second semiconductor material 26 may be formed using the same deposition method as the first semiconductor material 24, such as PVD, CVD, ALD, or any other suitable deposition method. The second semiconductor material 26 may be formed by introducing a second precursor containing the dopant along with the previously described first precursor during the deposition process. In the embodiment in which the dopant is an n-type dopant, the second semiconductor material 26 is formed by introducing the second precursor containing an n-type dopant, such as $PH_3$, $AsH_3$ or any other precursor containing an n-type dopant in a high-temperature deposition process along with the first precursor, such as silane. In some embodiments, the second semiconductor material 26 is formed to have a dopant with a first concentration between about 25 weight percentage (wt %) and about 50 wt %. In some embodiments, the second semiconductor material 26 has a second thickness T2 between about 3500 Å and about 30000 Å, such as about 10000 Å. Thereby, a sufficient dopant is provided to a doped third semiconductor material 28 (as shown in FIG. 2C) formed subsequently. In other embodiments, the second semiconductor material 26 may have any other suitable dopant concentration and thickness range.

Still referring to FIG. 2B, after the first semiconductor material 24 and the second semiconductor material 26 are formed, a heat treatment 70 (also referred as diffusion process) is performed on the first semiconductor material 24 and the second semiconductor material 26 so that the dopant in the second semiconductor material 26 diffuses into the first semiconductor material 24. In some embodiments of the present disclosure, the heat treatment 70 may be performed by a furnace anneal, a rapid thermal anneal (RTA), or any other suitable heat treatment method. In some embodiments of the present disclosure, the heat treatment 70 is performed at a temperature between about 800° C. and about 1200° C., such as 1000° C. for a heat treatment time between about 30 minutes and about 60 minutes, such as 45 minutes.

Next, referring to FIG. 2C, a doped third semiconductor material 28 is formed after the heat treatment 70 is performed. Specifically, the doped third semiconductor material 28 is formed by the dopant in the second semiconductor material 26 diffusing into the first semiconductor material 24.

It should be noted that, as shown in FIG. 2B, the second semiconductor material 26 is above the semiconductor substrate 20, the lining layer 22, the first semiconductor material 24 and the first trench 21, and the second semiconductor material 26 is not present in the first trench 21. Therefore, the dopant in the second semiconductor material 26 diffuses toward a depth direction of the first trench 21 during the heat treatment 70 so that the dopant in the doped third semiconductor material 28 has a decreasing concentration gradient in the depth direction of the first trench 21 after the heat treatment 70. In some embodiments of the present disclosure, after the heat treatment 70, the dopant in the top portion of the doped third semiconductor material 28 filled in the first trench 21 has a second concentration between about 15 wt % and about 40 wt %. The dopant in the bottom portion of the doped third semiconductor material 28 filled in the first trench 21 has a third concentration between about 0 wt % and about 35 wt %. In specific, the first concentration of the dopant in the second semiconductor material 26 is larger than the second concentration of the dopant in the top portion of the doped third semiconductor material 28 filled in the first trench 21. The second concentration of the dopant in the top portion of the doped third semiconductor material 28 filled in the first trench 21 is larger than the third concentration of the dopant in the bottom portion of the doped third semiconductor material 28 filled in the first trench 21.

Still referring to FIG. 2C, after forming the doped third semiconductor material 28, a planarization process 80, such as a chemical mechanical planarization (CMP), an etch back or any other suitable planarization process, is performed on the doped third semiconductor material 28 on the semiconductor substrate 20 to remove a portion of the doped third semiconductor material 28 outside the first trench 21. In some embodiments of the present disclosure, after the planarization process 80 is performed, the top surface of the remaining portion of the doped third semiconductor material 28 is substantially planar with the top surface of the semiconductor substrate 20. In other embodiments, the performing of the planarization process 80 may continue removing the lining layer 22 on the top surface of the semiconductor substrate 20 until exposing the top surface of the semiconductor substrate 20.

Figure 2D:
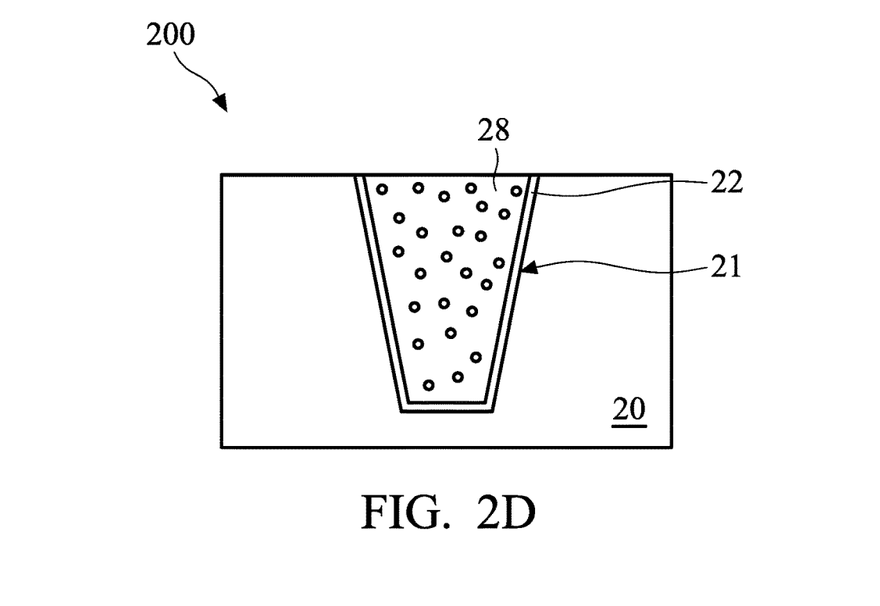

Referring to FIG. 2D, a semiconductor structure 200 is formed after the planarization process 80 is performed. The semiconductor structure 200 includes the semiconductor substrate 20, the first trench 21 disposed in the semiconductor substrate 20, the lining layer 22 disposed on the sidewalls and the bottom surface of the first trench 21, and the doped third semiconductor material 28 filled in the first trench 21. The top surface of the doped third semiconductor material 28 is planar with the top surface of the semiconductor substrate 20. The dopant in the doped third semiconductor material 28 has a decreasing concentration gradient in the depth direction of the first trench 21.

It should be noted that since the first semiconductor material 24 does not have a dopant, the first semiconductor material 24 has lower flowability at high temperatures than the second semiconductor material 26. During the heat treatment 70, since the first semiconductor material 24 with lower flowability overfills the first trench 21, after the heat treatment 70, there is no void or pipeline formed in the resulted doped third semiconductor material 28, and there is especially no void or pipeline formed in the portion of the doped third semiconductor material 28 that is filled into the first trench 21. When the semiconductor structure 200 is subjected to subsequent processes, the doped third semiconductor material 28 will not be contaminated. Therefore, the embodiments of the present disclosure can form a doped semiconductor material in the trench without forming voids or pipelines in the doped semiconductor material in the trench. Thereby, the reliability of a semiconductor device including the semiconductor structure 200 is enhanced. For example, in accordance with the method of fabricating the semiconductor structure 200 as shown in FIGS. 2A-2D, in some embodiments, the doped third semiconductor material 28 filled in the first trench 21 may be used as a gate electrode so that a semiconductor device having this gate electrode has a lower gate leak current.

Figure 2E:
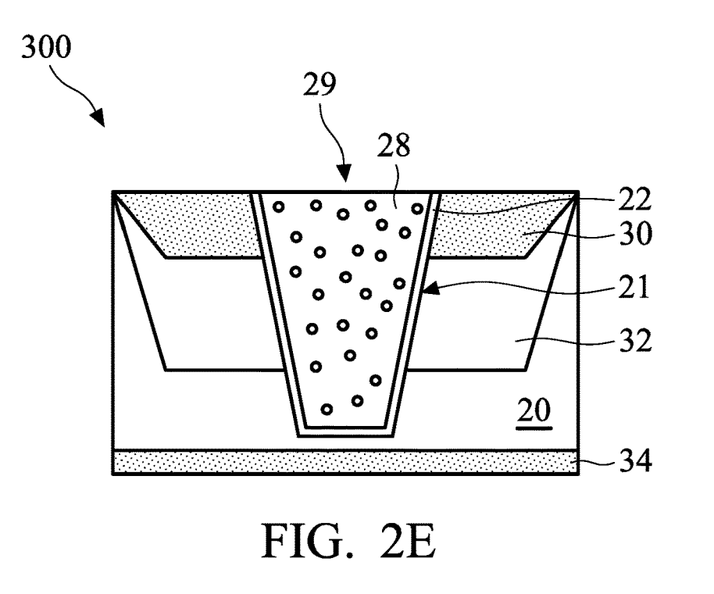
FIG. 2E shows a cross-sectional view of a semiconductor device having a trench gate in accordance with some embodiments of the present disclosure.

Referring to FIG. 2E, FIG. 2E shows a cross-sectional view of a semiconductor device 300 having a trench gate in accordance with some embodiments of the present disclosure. In some embodiments of the present disclosure, the doped third semiconductor material 28 filled in the first trench 21 may be used as a gate electrode 29 for the semiconductor device 300. After the semiconductor structure 200 as shown in FIG. 2D is formed, following processes are performed to complete the semiconductor device 300 of FIG. 2E.

The method of forming the semiconductor device 300 includes forming a p-type or n-type well region 32 in the semiconductor substrate 20, forming a source region 30 in the semiconductor substrate 20 to surround the gate electrode 29, and forming a drain region 34 at the bottom surface of the semiconductor substrate 20, wherein the drain region 34 is below the source region 30 and gate electrode 29. The well region 32, the source region 30 and the drain region 34 of the semiconductor device 300 may be formed using photolithography processes and ion-implantation processes.

It should be noted that since the dopant in the doped third semiconductor material 28 has a decreasing concentration gradient in the depth direction of the first trench 21, a lower portion of the gate electrode 29 of the semiconductor device 300 has lower gate-drain charges (Qgd). Thereby, the switching speed of the semiconductor device 300 is enhanced.

Figure 3:
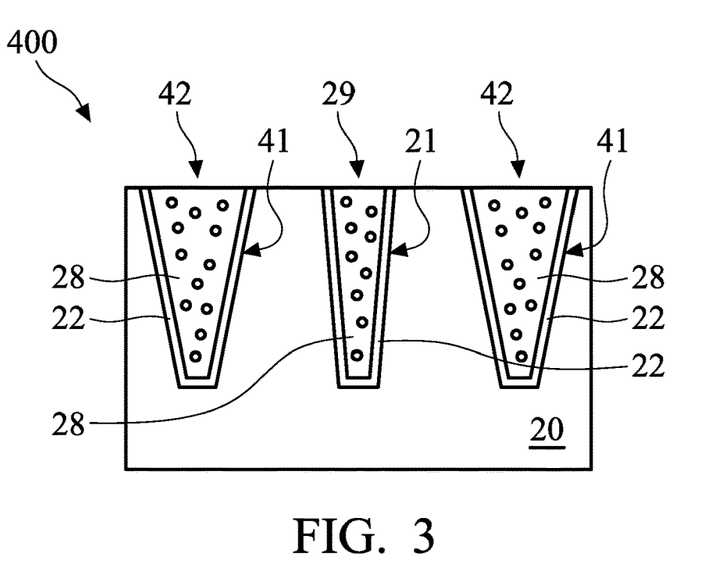
FIG. 3 shows a cross-sectional view of a semiconductor structure having an electric field termination part in accordance with some embodiments of the present disclosure.

FIG. 3 shows a cross-sectional view of a semiconductor structure 400 having an electric field termination part 42 in accordance with some embodiments of the present disclosure. It should be noted that the subsequently described elements or layers that are the same as or similar to those previously described will be denoted by the same or similar reference numerals, and the materials, fabricating methods and functions of the subsequently described elements or layers are the same as or similar to those previously described, and therefore, those will not be repeated in the following description.

Referring to FIG. 3, the difference between the embodiments shown in FIGS. 2D and 3 is that the semiconductor structure 400 further includes a second trench 41 which is between the first trench 21 and the edge of the semiconductor substrate 20. The method of fabricating the semiconductor structure 400 includes providing a semiconductor substrate 20, forming a first trench 21 in the semiconductor substrate 20, and forming a second trench 41 between the first trench 21 and the edge of the semiconductor substrate 20. The second trench 41 may be formed prior to, after, or simultaneously with the first trench 21. The second trench 41 may be formed using the same or similar photolithography processes and etching processes as the first trench 21.

The method of fabricating the semiconductor structure 400 further includes forming a lining layer 22 on the sidewalls and the bottom surface of the second trench 41, and forming a doped third semiconductor material 28 filled in the second trench 41. The formation of the doped third semiconductor material 28 filled in the second trench 41 may be performed by the method of forming the doped third semiconductor material 28 filled in the first trench 21 as shown in FIGS. 2B-2D. The doped third semiconductor material 28 filled in the second trench 41 may be formed simultaneously with the doped third semiconductor material 28 filled in the first trench 21.

Still referring to FIG. 3, in some embodiments of the present disclosure, the doped third semiconductor material 28 filled in the first trench 21 may be used as a gate electrode 29 for an active region. The doped third semiconductor material 28 filled in the second trench 41 may be used as an electric field termination part 42 which may balance lines of electric force from the active region. After the semiconductor structure 400 as shown in FIG. 3 is formed, other features such as a source region, a drain region and well regions may be formed subsequently to complete a semiconductor device.

In summary, some embodiments of the present disclosure overfill a trench with an undoped semiconductor material, form a semiconductor material containing a dopant on the undoped semiconductor material, and then perform a heat treatment on both semiconductor materials. As a result, there is no void or pipeline formed in the semiconductor material filled in the trench during the heat treatment, and a doped semiconductor material is formed in the trench after the heat treatment. Thereby, the problem caused by the case that materials (such as etchants, photoresists, dielectrics, or metals, etc.) used in subsequent processes flow into the voids or pipelines in the doped semiconductor material filled in the trench is prevented. Therefore, the reliability of the semiconductor device is enhanced, such as lower gate leak current.

In addition, in some embodiments of the present disclosure, the doped semiconductor material filled in the trench may be used as a gate electrode. Since the dopant in the doped semiconductor material filled in the trench has a decreasing concentration gradient in the depth direction of the trench, so the switching speed of the semiconductor device can be enhanced.

It should be noted that while the embodiments of the present disclosure illustrate the specific semiconductor structures and the methods of fabricating the same, the methods of forming a doped semiconductor material in the trench according to embodiments of the present disclosure may be applied to other semiconductor structures and/or device, such as CMOS transistors, BJTs, LDMOS transistors, VDMOS transistors, high-power MOS transistors, or any other type of transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   a trench disposed in the semiconductor substrate; and
   a doped semiconductor material filled in the trench, wherein a top surface of the doped semiconductor material is planar with a top surface of the semiconductor substrate, and a dopant in the doped semiconductor material has a decreasing concentration gradient in a depth direction of the trench,
   wherein the dopant in a top portion of the doped semiconductor material has a concentration between 15 wt % and 40 wt % and the dopant in a bottom portion of the doped semiconductor material is between 0 wt % and 35 wt %.

2. The semiconductor structure as claimed in claim 1, wherein the dopant comprises P, As or Sb.

3. The semiconductor structure as claimed in claim 1, wherein the doped semiconductor material in the trench is a gate electrode.

4. The semiconductor structure as claimed in claim 3, further comprising:
   a source region disposed in the semiconductor substrate and surrounding the gate electrode; and
   a drain region disposed at a bottom surface of the semiconductor substrate and below the source region and the gate electrode.

5. The semiconductor structure as claimed in claim 1, further comprising another trench disposed between the trench and an edge of the semiconductor substrate, wherein the doped semiconductor material is further filled in the other trench to be used as an electric field termination part.

6. The semiconductor structure as claimed in claim 1, further comprising a lining layer disposed on sidewalls and a bottom surface of the trench, wherein the lining layer comprises a high dielectric constant dielectric material.

7. A semiconductor structure, comprising:
   a semiconductor substrate;
   a gate electrode which extends downwardly from an upper surface of the semiconductor substrate, wherein the gate electrode is made of a semiconductor material, wherein a dopant in a top portion of the gate electrode has a first concentration between 15 wt % and 40 wt %, and the dopant in a bottom portion of the gate electrode has a second concentration that is lower than the first concentration and between 0 wt % and 35 wt %; and
   a lining layer between the gate electrode and the semiconductor substrate.

* * * * *